United States Patent
Nallan et al.

(10) Patent No.: US 6,660,127 B2
(45) Date of Patent: Dec. 9, 2003

(54) APPARATUS FOR PLASMA ETCHING AT A CONSTANT ETCH RATE

(75) Inventors: Padmapani Nallan, San Jose, CA (US); John Holland, San Jose, CA (US); Valentin Todorov, Fremont, CA (US); Thorsten Lill, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/075,223

(22) Filed: Feb. 12, 2002

(65) Prior Publication Data

US 2002/0137352 A1 Sep. 26, 2002

Related U.S. Application Data

(63) Continuation of application No. 09/401,603, filed on Sep. 22, 1999, now Pat. No. 6,399,507.

(51) Int. Cl.[7] .............. C23C 16/00; C23F 1/00
(52) U.S. Cl. .............. 156/345.48; 118/723 I; 118/723 AN
(58) Field of Search .......... 118/723 I, 723 IR, 118/723 AN; 156/345.48, 345.49; 3115/111.51; 438/706, 710

(56) References Cited

U.S. PATENT DOCUMENTS

| | | | |
|---|---|---|---|
| 4,208,241 A | | 6/1980 | Harshbarger et al. |
| 4,226,665 A | | 10/1980 | Mogab |
| 5,138,973 A | | 8/1992 | Davis et al. |
| 5,376,223 A | | 12/1994 | Salimian et al. |
| 5,454,903 A | | 10/1995 | Redeker et al. |
| 5,571,366 A | * | 11/1996 | Ishii et al. ............ 156/345.26 |
| 5,576,243 A | | 11/1996 | Wuu et al. |
| 5,667,701 A | * | 9/1997 | Sato et al. ............... 216/61 |
| 5,733,820 A | | 3/1998 | Adachi et al. |
| 5,779,926 A | | 7/1998 | Ma et al. |
| 5,783,101 A | | 7/1998 | Ma et al. |
| 5,882,538 A | | 3/1999 | Martin et al. |
| 5,894,169 A | | 4/1999 | Givens et al. |
| 5,904,566 A | | 5/1999 | Tao et al. |
| 5,926,743 A | | 7/1999 | Xi et al. |
| 6,447,636 B1 | * | 9/2002 | Qian et al. ............. 156/345.48 |
| 6,458,239 B1 | * | 10/2002 | Bhardwaj et al. ...... 156/345.24 |

FOREIGN PATENT DOCUMENTS

| | | |
|---|---|---|
| EP | 0 489 407 A2 | 6/1992 |
| EP | 0 702 391 A2 | 3/1996 |
| WO | WO 98/11594 | 3/1998 |

OTHER PUBLICATIONS

K. Suzuki et al., "Power trasnfer efficiency and mode jump in an inductive RF discharge," Plasma Sources Sci. Technol., 1998, pp. 13–20, vol. 7, UK.

Padmapani Nallan et al., "U. S. patent application for: Process for Etching Silicon–Containing Layers on Semiconductor Substrates." Ser. No.: 09/116,621. Filed: Jul. 16, 1998.

* cited by examiner

*Primary Examiner*—Luz L. Alejandro
(74) *Attorney, Agent, or Firm*—Shirley L. Church; Joseph Bach

(57) ABSTRACT

We have discovered a method which permits plasma etching at a constant etch rate. The constant etch rate is achieved by controlling plasma process parameters so that a stable plasma is obtained, with a portion of the power deposited to the plasma being a capacitive contribution, and a portion being an inductive contribution. In particular, a stable plasma may be obtained within two process regions. In the first region, the gradient of the capacitive power to the power applied to the inductively coupled source for plasma generation [$\partial P_{cap}/\partial P_{RF}$] is greater than 0. In the second region, plasma stability is controlled so that [$\partial P_{cap}/\partial P_{RF}$] is less than 0 and so that $P_{cap} << P_{RF}$. Typically, the magnitude of $P_{cap}$ is less than about 10% of the magnitude of $P_{RF}$. Operation of the etch process in a stable plasma region enables use of a timed etch end point.

5 Claims, 7 Drawing Sheets

APPARATUS FOR PLASMA ETCHING AT A CONSTANT ETCH RATE

This application is a continuation application of application Ser. No. 09/401,603, filed Sep. 22, 1999, now U.S. Pat. No. 6,399,507.

BACKGROUND OF THE INVENTION

1. Field of the Invention

The present invention pertains to a method for providing a stable plasma useful in the etching of films. The method is particularly useful in the etching of silicon-containing films which differ in overall chemical composition, when it is desired to simultaneously etch such films at a substantially equivalent etch rate. For example, adjacent areas of a semiconductor substrate where polysilicon or silicon is doped and undoped can be etched at substantially the same rate. Further, the method provides critical dimension bias control for the feature being etched. The stable plasma provided by the method makes possible a reliable timed etch end point. And, finally, the method offers the advantage that the process chamber in which the etching is carried out remains particularly clean during the etch process, with minimal etch byproduct deposited upon chamber surfaces.

2. Brief Description of the Background Art

K Suzuki et al., in an article entitled "Power transfer efficiency and mode jump in an inductive RF discharge", Plasma Sources Sci. Technol. 7 (1998) 13–20, describe a plasma density jump observed in a large-diameter (50 cm) high density ($>10^{11}$ cm$^{-3}$) plasma, where the plasma is produced in a few mTorr argon by inductive RF discharge using a conventional external antenna or a plasma-immersed internal antenna. A mechanism for the density jump is explained in terms of the density dependence of the power transfer efficiency. The density jump is said to correspond to the mode jump from the capacitive to the inductive discharges. Representative formulae are given for capacitive power absorption, $P_{cap}$ and inductive power absorption $P_{ia}$.

In recent process development work related to a method for etching silicon-containing layers, a method for obtaining simultaneous cleaning of etch byproducts from the etch chamber wall was discovered. This technology is disclosed in pending U.S. patent application, Ser. No. 08/969,122 of Qian et al., Entitled: "Self-Cleaning Etch Process", filed Nov. 12, 1997, and is hereby incorporated herein by reference. Subsequently, in a related development, a method was developed which permitted simultaneous etching of silicon-containing layers having different dopant concentrations where the etch rate was substantially uniform across the differing materials. This technology is disclosed in pending U.S. patent application, Ser. No. 09/116,621 of Nallan et al., Entitled: "Process For Etching Silicon-Containing Layers On Semiconductor Substrates", filed Jul. 15, 1998, and is hereby incorporated herein by reference. This second patent application is a continuation-in-part of the Qian et al. application described above, and both of these applications are assigned to the assignee of the present invention.

These patent applications describe high density plasma etching in a dual power processing apparatus. In particular, in the dual power processing apparatus, the shape of the processing chamber may be specially designed and the power applied to the apparatus for generation of the plasma is separately controlled from the power applied to bias the substrate. This has a substantial effect on the etch results obtained, as is evident in the disclosure of the inventions of Qian et al. and Nallan et al. referenced above.

The Qian et al. and Nallan et al. applications disclose the use of a plasma source gas which includes four main components: a bromine-containing gas including one or more of HBr, Br$_2$, and CH$_3$Br; a chlorine-containing gas including one or more of Cl$_2$, and HCl; an inorganic fluorinated gas including one or more of NF$_3$, CF$_4$, and SF$_6$; and an oxygen-comprising gas. Typically, the oxygen-comprising gas is a mixture of an inert gas with oxygen, such as He—O$_2$, where the O$_2$ ranges from about 20% to about 30% by volume of the gas mixture. The volumetric flow ratio of the various plasma source gas components is selected so that the relative etch rates of the different silicon-containing films vary by less than about 10%.

In one embodiment of the disclosed technology a two step etching process is used. In the first step, the plasma source gas includes all of the four components described above. The CF$_4$ component both tends to equalize the etch rate among the different silicon-containing films (such as doped and undoped silicon) and tends to assist in removal of etch byproducts from the etch process chamber wall. However, with CF$_4$ present, the selectivity ratio of polysilicon: silicon oxide is lower. This is important, for example, when a silicon film (doped in some areas) overlies a thin silicon-oxide film (functioning as a gate for a transistor). The etch rate for the silicon oxide in the four-component plasma etchant system is sufficiently rapid relative to the polysilicon etch rate that there is a danger of etching through the thin silicon oxide film before the polysilicon etching process can be terminated. To solve this problem, in a second step (which may be part of a continuous process), the CF$_4$ is removed from the plasma source gas so that a "soft landing" is achieved when the end point of the polysilicon etch process occurs. By removing the CF$_4$ and increasing the selectivity (etch rate ratio) of polysilicon to silicon oxide, it is possible to etch up to a thin underlying silicon oxide layer without the danger of etching through.

It was desired to use a timed etch end point for the first etch step described above and a process variable monitored etch end point for the second step. However, there was difficulty in using a timed etch end point for the first step, because the etch rate was not sufficiently predictable.

SUMMARY OF THE INVENTION

Subsequent to development of the technology described above, we discovered that under some process conditions an unstable plasma developed. A brightening of the plasma was observed, with an accompanying change in etch rate. This unstable plasma was observed in some instances and not in others. We investigated this unstable plasma in an attempt to obtain a more predictable etch rate, with the goal in mind of enabling the use of a timed etch end point for the first etch step.

In accordance with the present invention, the etch plasma density is controlled to provide plasma stability. We have discovered that it is possible to operate a stable plasma with a portion of the power deposited to the plasma being a capacitive contribution and a portion of the power deposited being an inductive contribution. In particular, a stable plasma may be obtained within two process regions. In the first region, the gradient of the capacitive power to the power applied to the inductively coupled source for plasma generation [$\partial P_{cap}/\partial P_{RF}$] is greater than 0. In the second region, plasma stability is controlled so that [$\partial P_{cap}/\partial P_{RF}$] is less than 0 and so that $P_{cap} \ll P_{RF}$. Typically, the magnitude of $P_{cap}$ is about 10% or less of the magnitude of $P_{RF}$. In these equations, $P_{cap}$ is the calculated capacitive power deposited to the plasma, and $P_{RF}$ is the actual power applied. The stability of power deposition to the substrate (workpiece) is achieved by choosing both the RF power level applied to the inductively coupled plasma generation source and the operating pressure in the process chamber to provide a stable plasma. It is preferred to operate under conditions where $[\partial P_{cap}/\partial P_{RF}]$ is greater than 0, because the etch results are superior, due to a more favored ion to neutral ratio in the plasma.

We have also discovered that, at a given application of power to the plasma generation source, the stability of the plasma may be extended by increasing the pressure in the etch process chamber. This enables operation of the etch process using lower power application for plasma generation. The stable plasma operating regime is overlaid upon the process which permits etching of different silicon-containing layers at substantially the same etch rate, while reducing the need to clean the process chamber. Further, process conditions may be adjusted to provide the desired etch profile, with reduced microloading effect; the desired selectivity toward the silicon-containing layers relative to an adjacent layer of material (such as a patterned resist layer); and etch uniformity across a substrate. The stable high density plasma combined with the etch chemistry and multiple step method disclosed herein provides a more uniform three dimensional etch across the wafer, in general.

In particular, the plasma stability may be controlled by selection of operating conditions that provide stable plasma deposition of the RF power supplied to generate the plasma. The process conditions are provided by choosing both the RF power applied to the inductively coupled source for plasma generation and the etch chamber operating pressure, in view of the particular gases from which the plasma is generated.

Another potential method for determining whether the plasma will be stable is to actually measure the capacitive and inductive components of the plasma. In this case the measured capacitive component is $P_{cap2}$ and the measured inductive component is $P_{ind}$. In this method, the magnitude of $P_{cap2}$ is typically less than or equal to 10% of the magnitude of $P_{ind}$ in the stable plasma region. An approximate $P_{cap}$ may be determined by monitoring the amount of RF current flowing to the chamber ground.

When the apparatus used is one for which no data is available, it is possible to determine the two process regions in which a stable plasma may be obtained using minimal experimentation. The first stability region, in which $[\partial P_{cao}/\partial P_{RF}]$ is greater than 0 may be determined by setting $P_{cap2}$ or $P_{cap}$ and $P_{RF}$ so that this condition is met at a relatively low RF power and at a relatively low process chamber pressure (for example, and not by way of limitation, about 2 mTorr). The RF power is then increased until an instability in the plasma is observed. This procedure is repeated for a series of increasing process chamber pressures. The maximum chamber pressure to be used may be determined by the characteristics of the etched feature, etch uniformity across the wafer, selectivity between masking layers and the silicon-containing layer to be etched, and other parameters related to the resultant etched product.

To determine the second stability region, in which the $[\partial P_{cao}/\partial P_{RF}]$ is less than 0 and $P_{cap} << P_{RF}$: $P_{RF}$ may be set at a value about 100% greater than the maximum RF power determined to produce a stable plasma in the first stability region (and at the maximum process chamber pressure used which provided an acceptable result). The process chamber pressure is then decreased until an unstable plasma is observed. The RF power is then decreased and the process chamber pressure at which instability occurs is observed for a number of decreasing RF power applications.

A stable plasma enables use of a timed etch end point for etching a particular film or layer. Although the method of the invention is applicable to a variety of materials, the method is described in detail herein with reference to a semiconductor structure including a silicon-containing layer.

The process conditions for a stable plasma must be overlaid on the effect of the process variables on etch characteristics (particularly of materials such as masking layers, barrier materials and dielectric gate materials) to provide an acceptable manufacturing etch process. Etch characteristics such as, but not limited to, etch rate, selectivity toward various substrate materials, profile control of the etched feature, and etch uniformity across the substrate must be satisfactory at the process conditions which provide the stable plasma. Further, the etch process must be sufficiently clean so that an acceptable number of substrates can be processed prior to the need to wet clean the process chamber.

In an embodiment of the invention where a silicon-containing layer is being etched, the process gases from which the plasma is produced include one or more of HBr, $Br_2$, and $CH_3Br$; a chlorine-containing gas, such as $Cl_2$ and/or HCl; an inorganic fluorinated gas such as $NF_3$, $CF_4$, $SF_6$, and combinations thereof, and an oxygen-comprising gas which is typically diluted with an inert gas. The combination of process gas components is selected to provide the desired selectivity so that the silicon-containing layer will etch at a significantly more rapid rate than an adjacent layer, for example, the masking layer used to pattern the silicon-containing layer. Typically the masking layer is a DUV resist or an I-line resist (which do not contain silicon). The silicon-containing layer may contain doped and undoped regions, and when this is the case, the combination of process gas components is further selected to etch the doped and undoped regions at etching rates which typically do not differ more than about 10%.

The features to be etched into the silicon-containing layers typically have a feature size of less than about 0.5 µm. In addition, frequently the aspect ratio of the features is greater than 2:1. To etch features of this size and have a satisfactory etched structure, there are several critical results which must be achieved during the etch process. The etch rate of the silicon-containing layer should be at about 1,500 Å/min. or higher to be economically advantageous. (When a two step etch process is used, wherein a first portion of the layer is etched rapidly and a second portion approaching the end point is etched more slowly, it is the first portion etch which should be at this etch rate.) The etch selectivity of the silicon-containing layer relative to an adjacent layer (the ratio of the etch rate of the silicon-containing layer to the etch masking layer, for example) should be at least 2:1. When the feature being etched is lines and spaces, the profile angle for the etched feature should range from about 88° to about 90°. The profile microloading should be less than about 2°, and the max-min etch uniformity across the substrate should not vary by more than about one standard deviation, σ, (more than about ±2%).

The critical results which must be achieved may vary depending on the feature being etched, but etch rate, selectivity, etch uniformity, and microloading are of constant importance. Whatever the critical results are, these must be overlaid on the requirements for a stable plasma in determining an acceptable operating range within the process variables. In any case, meeting these critical results is extremely difficult when operating within process conditions which produce an unstable plasma.

DETAILED DESCRIPTION OF THE INVENTION

Figure 1:
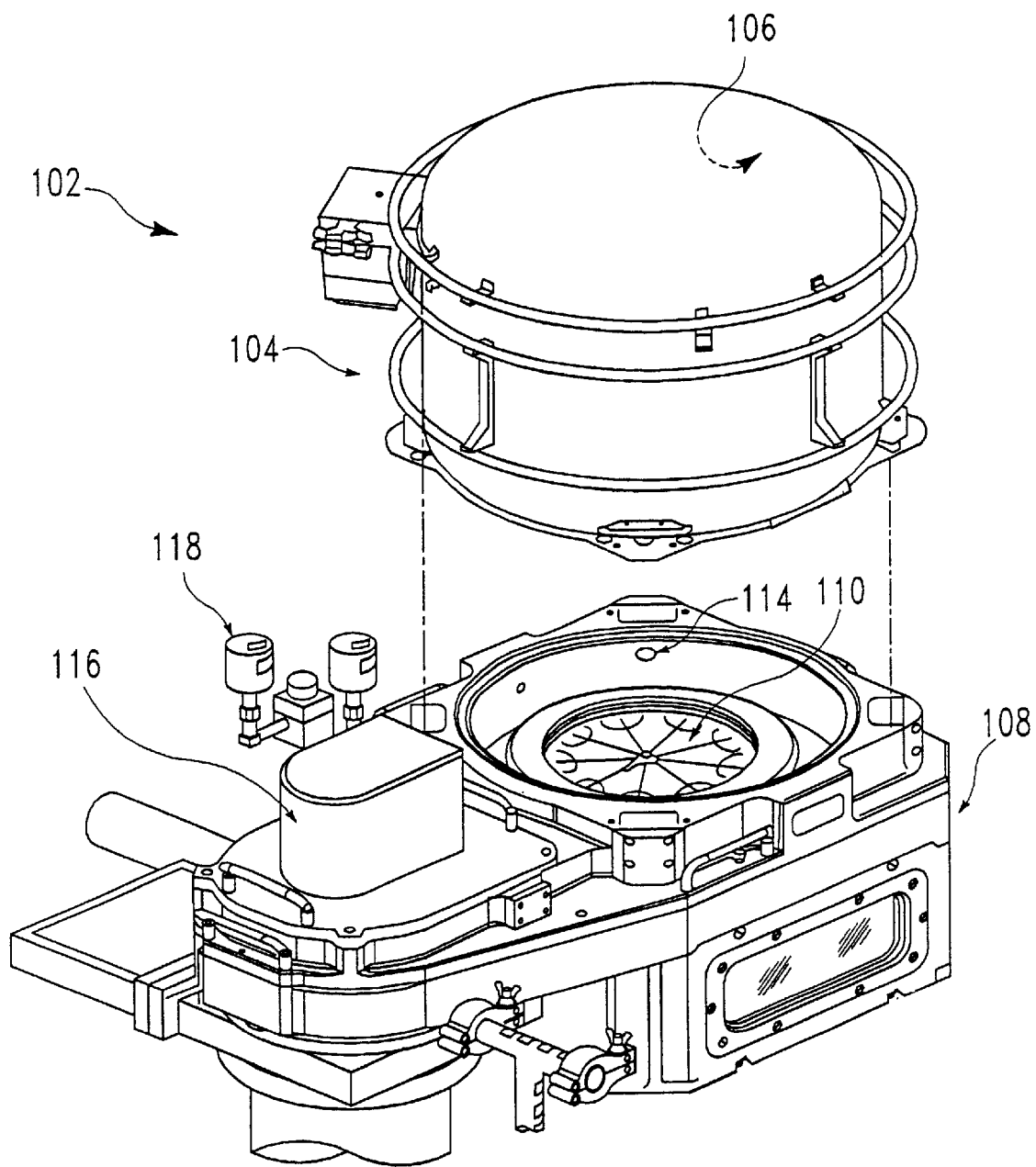
FIG. 1 is a schematic of an individual polysilicon etch chamber of the type used in an Applied Materials' CENTURA® DPS™ polysilicon etch system, which is an example of an etch processing apparatus which can be used for performing the method of the invention.

The present invention pertains to controlling etch plasma density to provide plasma stability so that a timed etch point can be used during etch and so that repeatability can be achieved in the etch process in general. In one embodiment, the etch processing apparatus has a dual power control, where the power applied to generate the plasma is separately controlled from the power applied to produce a substrate bias. This enables operation of the etch process using lower power application for plasma generation. From the etch process conditions which produce an etched product meeting critical requirements, process conditions are selected which provide a stable plasma based on the discoveries disclosed herein.

In the embodiments described in the Examples herein, plasma stability is controlled during etch of a silicon-containing layer. The stable plasma operating regime is overlaid upon the process which permits etching of different silicon-containing layers at substantially the same etch rate, while reducing the need to clean the process chamber. Further, process conditions may be adjusted to provide the desired etch profile, with reduced microloading effect; the desired selectivity toward the silicon-containing layers relative to an adjacent layer of material (such as a patterned resist layer); and etch uniformity across a substrate. The stable high density plasma combined with the etch chemistry and multiple step method disclosed herein provides a more uniform three dimensional etch across the wafer, in general.

I. Definitions

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined below.

The term "anisotropic etching" refers to etching which does not proceed in all directions at the same rate.

The term "bias power" refers to the power applied to the substrate support pedestal.

The term "etch profile" (or "feature profile") generally refers to, but is not limited to, the cross-sectional profile of the sidewall of an etched feature. In many instances herein, the etch profile is described in terms of an angle between the sidewall and the surface on which the feature stands (i.e., the substrate). The term "vertical profile" refers to a feature profile wherein a cross-section of the feature exhibits sidewalls which are perpendicular to the surface on which the feature stands. The term "reentrant profile" (also known as an "undercut" profile) refers to a feature profile wherein the width of the cross-section of the feature is smaller (the adjacent opening is larger) as the distance away from the opening on the substrate increases. The term "tapered profile" refers to a feature profile wherein the width of the cross-section of the feature is larger (the adjacent opening is smaller) as the distance away from the opening on the substrate surface increases.

The term "etch rate microloading" refers to the difference between the average etch rate of lines within a dense array of lines and the average etch rate of isolated lines on the same substrate.

The term "feature" refers to, but is not limited to, interconnects, contacts, vias, trenches, and other structures which make up the topography of the substrate surface.

The term "feature size" typically refers to the smallest dimension of a feature.

The term "isotropic etching" refers to etching which proceeds in all directions at the same rate.

The term "profile microloading" refers to, but is not limited to a difference in the etched feature profile for lines within a dense array of lines and spaces and the profile within isolated features on the same substrate.

The term "selectivity" refers either to 1) the ratio of the etch rate of a first material to the etch rate of a second material, or 2) the etch rate of a first material divided by the etch rate of a second material. If the first material has a faster rate of etching than the second material, then selectivity will be greater than 1:1, or 1.

The term "source power" refers to the power used to generate plasma ions and neutrals, whether directly in an etching chamber or remotely, as in the case of a microwave plasma generator.

II. An Apparatus for Practicing the Invention

Figure 2:
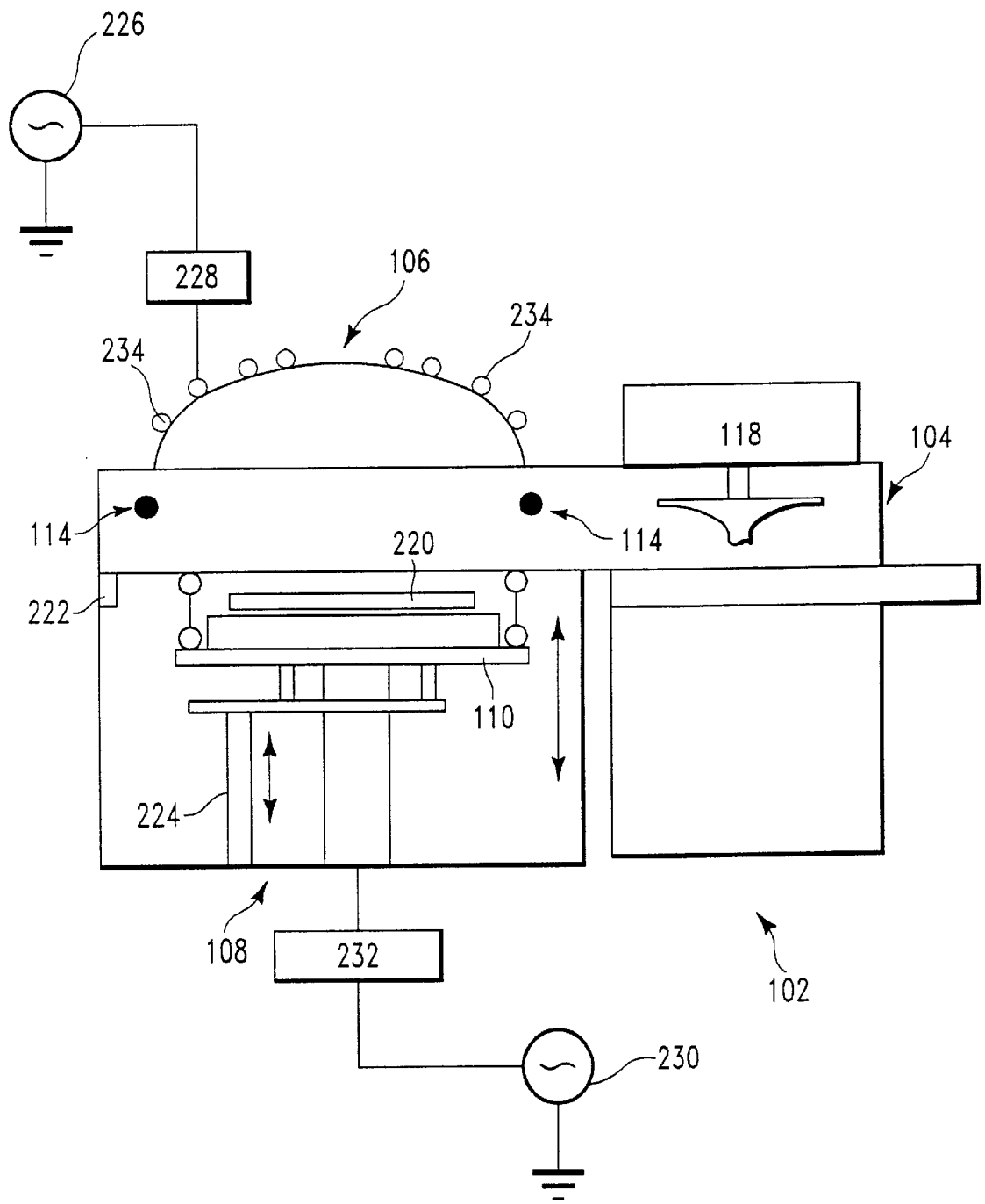
FIG. 2 is a schematic of a cross-sectional side view of an individual CENTURA® DPS™ polysilicon etch chamber 102.

The method of the invention is performed in an etch processing apparatus which provides for separate power control of a plasma generation source and a substrate biasing device. An example of such an apparatus is the Applied Materials' CENTURA® polysilicon etch system. FIGS. 1 and 2 are schematics of an individual CENTURA® DPS™ polysilicon etch chamber 102 of the type used in the Applied Materials' CENTURA® polysilicon etch system. The CENTURA® DPS™ polysilicon etch chamber 102 is configured to be mounted on a standard CENTURA® 5200 etch mainframe.

FIG. 1 shows a schematic of an individual CENTURA® DPS™ polysilicon etch chamber 102 of the type used in the CENTURA® etch system. The CENTURA® DPS™ polysilicon etch chamber 102 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system 118 with a throttle valve 116.

FIG. 2 shows a schematic of a cross-sectional side view of the polysilicon etch chamber 102. During processing, a substrate 220 is introduced into the lower chamber 108 through inlet 222. The substrate 220 is held in place by means of a static charge generated on the surface of electrostatic chuck (ESC) cathode 110 by applying a DC voltage to a conductive layer located under a dielectric film on the chuck surface. The cathode 110 and substrate 220 are then raised by means of a wafer lift 224 and sealed against the upper chamber 104 in position for processing. Etch gases are introduced into the upper chamber 104 via the ceramic gas injection nozzles 114. The polysilicon etch chamber 102 uses an inductively coupled plasma generated using inductive coil 234, to which power is applied via power source 226 and matching network 228 operating at 12.56 MHZ for generating and sustaining a high density plasma. The wafer is biased with an RE source 230 and matching network 232 operating at 13.56 MHZ. Power to the plasma source 226 and substrate biasing means 230 are controlled by separate controllers (not shown).

When the end point of an etch is signaled by the etch reaching an interface with a different material, an endpoint subsystem (not shown) senses the end of the etch process by monitoring changes in the light emitted by the plasma in the etch chamber 102. The standard CENTURA® DPS™ endpoint system consists of a monochromator and photomultiplier tube which sends data to a computer automated control system. Data is then displayed on a PC monitor. The operator sets an algorithm which controls the endpoint system.

Figure 3A:
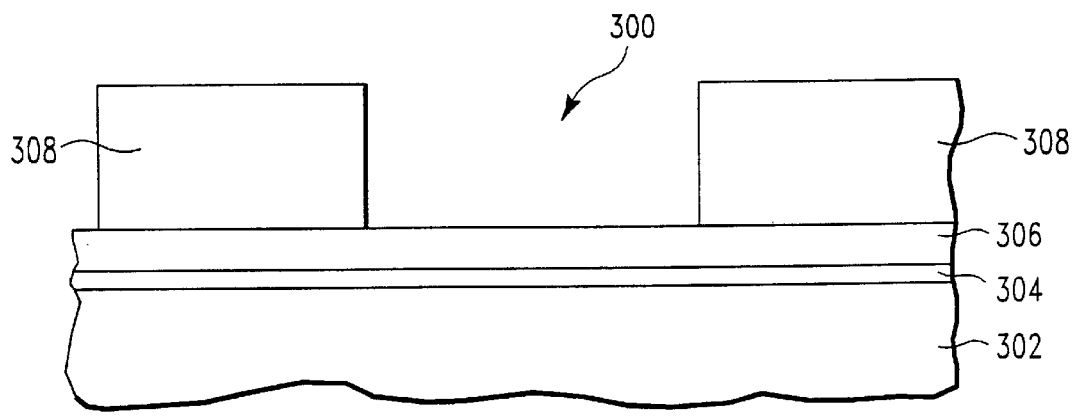
FIG. 3A shows a schematic of a cross-sectional view of a typical beginning structure 300 used for polysilicon etch experiments as described herein.

III. A Method for Etching Various Silicon-containing Substrates at Substantially the Same Etch Rate FIG. 3A shows a schematic of a beginning structure 300 used for polysilicon etch experiments described subsequently herein. The underlying substrate 302 is typically silicon. There may be doped or implanted regions (not shown) in substrate 302. Overlying substrate 302 is a thin layer of a gate material 304, typically silicon oxide. The gate material is a thin layer, for example ranging from about 15 Å to about 40 Å in thickness. Overlying gate layer 304 is a layer of polysilicon 306. The polysilicon may have implanted or doped regions(not shown). Typically, the polysilicon layer 306 ranges in thickness from about 1,500 Å to about 2,500 Å. Overlying polysilicon layer 306 is a patterned masking material 308. Patterned masking layer 308 is typically a deep ultra violet (DUV) photoresist or an I-line photoresist of the kind known in the art. The thickness of the photoresist depends on the ratio of the etch rate of the resist material to the etch rate of the underlying polysilicon (the selectivity toward the photoresist material). There may be a thin anti-reflective coating (ARC) layer (not shown) between masking layer 308 and polysilicon layer 306.

Figure 3B:
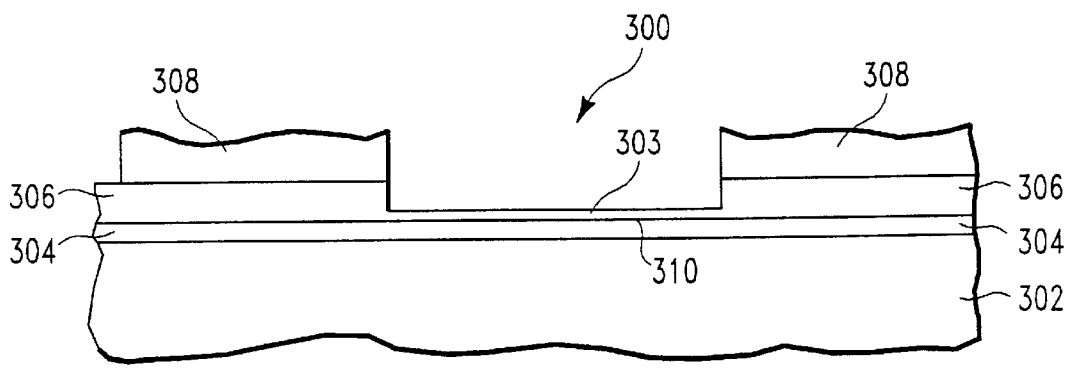
FIG. 3B shows the structure of FIG. 3A after a timed etch of the polysilicon to a location near an underlying thin layer of silicon oxide.

FIG. 3B shows the structure of FIG. 3A after a timed etch of the polysilicon layer 306 to a location near the underlying layer gate oxide 304. Since the plasma etchant used to remove the majority of the polysilicon layer 306 does not reach thin gate layer 304 (which is typically also a silicon-containing material), it is possible to use a fluorine-containing etchant such as $CF_4$, $NF_3$, or $SF_6$ in combination with $Cl_2$ or other chlorine-comprising agent to etch polysilicon layer 306. The use of the fluorine-containing etchant in combination with the more standard chlorine-comprising agent makes it possible to etch the polysilicon layer more rapidly, makes possible the etching of silicon-comprising areas having different compositions at substantially the same rate (within 10% of each other), and helps remove byproducts from the etch chamber walls, keeping the chamber walls cleaner. For example, the addition of $CF_4$ to a standard plasma etchant comprising $Cl_2$, HBr, and $O_2$ (commonly diluted with helium), makes it possible to etch polysilicon having doped and undoped regions at a substantially uniform rate, while providing a "clean" process. Since the gate layer 304 is typically silicon oxide which would be etched through rapidly by the plasma etchant containing $CF_4$, it is advisable to stop the etching short of the gate layer 304. If the gate layer were a different material less affected by $CF_4$, this would not be necessary.

Figure 3C:
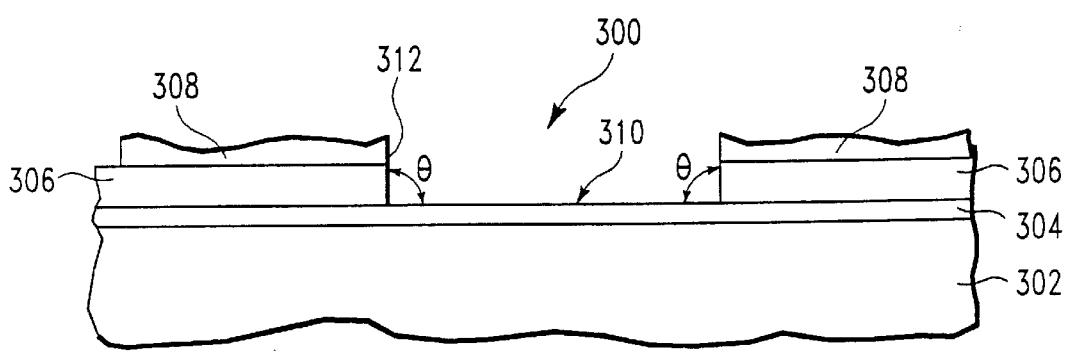
FIG. 3C shows the structure of FIG. 3B after etch to the upper surface of (interface with)the thin layer of silicon oxide.

FIG. 3C shows the structure of FIG. 3B after etch to the upper surface of (interface with)the thin layer of silicon oxide 304. This additional etching to the interface 310 is carried out using the $Cl_2$, HBr, $O_2$ plasma etchant, for example. Detection of the end point for etching to the interface 310 may be carried out using standard techniques such as optical monitoring of the space above the substrate surface for changing chemical composition.

As is evident from the above description, it is important to be able to use a timed end point for the etch step shown in FIG. 3B, where the polysilicon layer 306 is only partially etched toward the gate layer 304 interface, leaving a thin layer 303 over the interface 310. During development of this process, we discovered that a timed end point was unreliable. We discovered that under our operating conditions in the Centura DPS™ etch chamber previously described, the distance etched through polysilicon layer 306 varied when a timed end point is used.

Our operating conditions were: a plasma source gas comprising 25 sccm of $CF_4$, 60 sccm of $Cl_2$, 100 sccm of HBr, and 18 sccm of He—$O_2$ mixture (30% by volume $O_2$); a substrate temperature of about 50° C., a process chamber pressure of 4 mTorr, a plasma source power of 475 W, and a substrate bias power of 80 W. The selectivity toward polysilicon relative to DUV resist was 1.8:1. When an I-Line resist was used, the selectivity was about 2.9:1; and the polysilicon etch rate was about 2,500 Å/min. The profile obtained (the angle θ between the vertical sidewall 312, shown on FIG. 3C, and the gate interface surface 310 was 88°–90°. The profile microloading effect on the angle θ of sidewall 312 was a decrease of about 2° (from θ=86°–88° to θ=88°–90°). The max-min uniformity of etch rate across the surface of the substrate (from the center of a silicon wafer toward the edge) varied by about one standard deviation, σ, or about ±2%.

As one skilled in the art can see from the above data, the process produced a high quality etch profile, at an economically acceptable etch rate, with good etch uniformity across the wafer. The problem was that, due to instability in the etch plasma, there was lack of predictability of the timed end point for etching the polysilicon with the $CF_4$ present. There was a risk of etching through the thin gate oxide 304.

Figure 9:
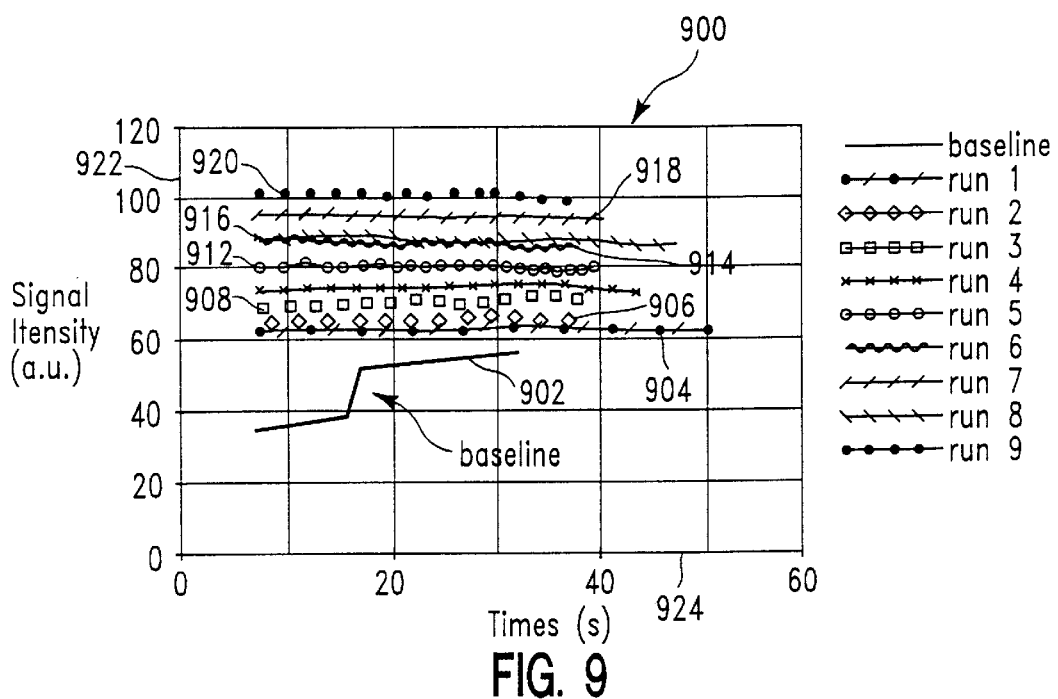
FIG. 9 shows data for a plasma emission signal intensity from an emission end point system as a function of etch time during a series of wafer etch experiments.

During our investigation of the cause of the variation in depth of etching when a timed end point was used for the etch, we discovered the problem was plasma instability. Between about 10 and 20 seconds into the etch process we sometimes observed an increase in the brightness (intensity) of the plasma. This phenomenon was unpredictable. It occurred in some instances and not in others. The variation in depth of etch for a given time period was attributed to the change in the plasma evidenced by the jump in plasma intensity. FIG. 9 shows data for plasma signal intensity through an etch process for a series of experimental substrate etches. The "baseline" 902 represents the "jump" in the plasma brightness which sometimes occurred during the etch process, prior to the present invention which provided plasma stability.

IV. A Method for Providing a Stable Plasma in a Dual Power Plasma Etch System

Figure 4:
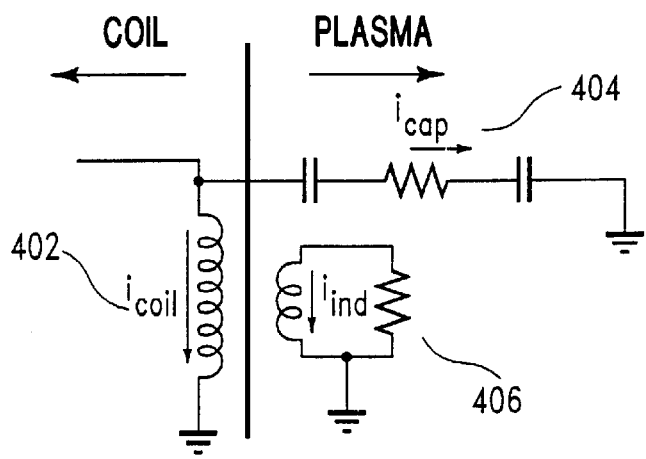
FIG. 4 shows a diagram of the circuit representative of current flows to the etch plasma.

FIG. 4 shows a diagram of the circuit representative of current flows to the etch plasma. The RF current flow 402 through the inductive coil (shown as element 234 on FIG. 2) produces current flow to the plasma interior of process chamber 104. The current flow to the plasma has two main components, a capacitive component 404 and an inductive component 406 (there may be current losses due to other current paths; however, these are negligible by comparison and so are ignored in the present calculations).

Figure 5:
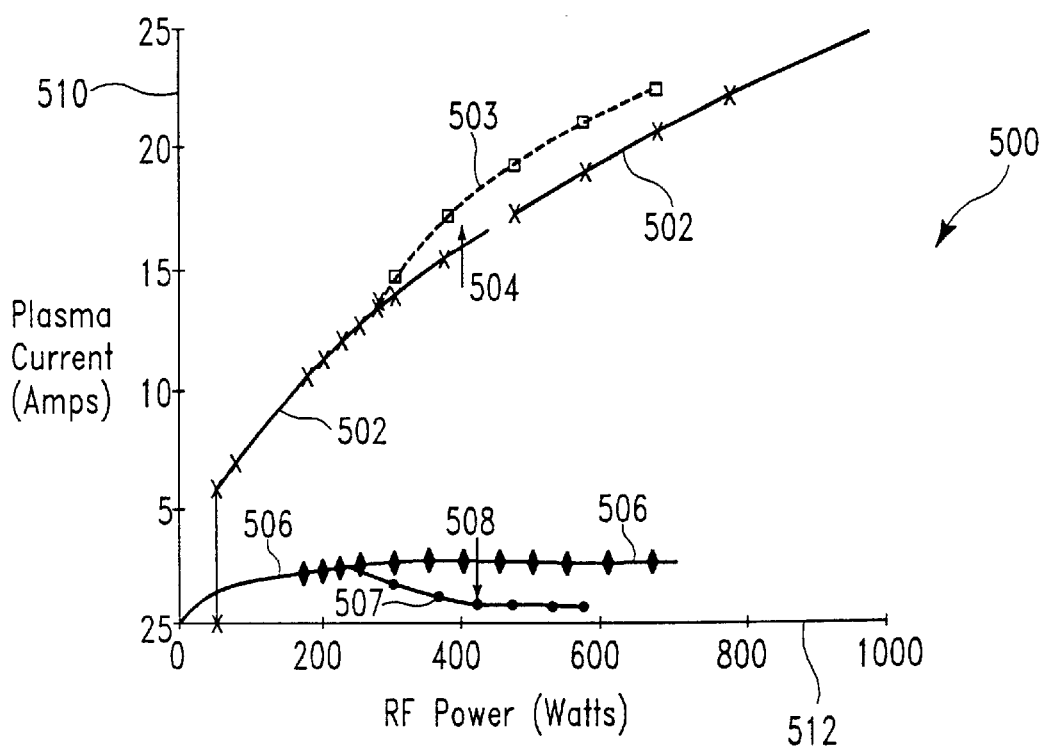
FIG. 5 shows a graph of a plasma capacitive current with corresponding plasma inductive current as a function of the amount of power applied for plasma generation, when the etchant plasma comprises $CF_4$, HBr, $Cl_2$, and $O_2$, and the etch process chamber is at a pressure of 4 mTorr.

We determined that the change in plasma light intensity which sometimes occurred during our etch process was a result of a sudden decrease in the capacitive current component (with corresponding increase in the inductive current component) of the plasma. FIG. 5 shows a graph of a plasma capacitive current component with corresponding plasma inductive current component as a function of the amount of power applied for plasma generation, when the etch process chamber is at a pressure of 4 mTorr. Curve 506 illustrates the capacitive current component, while Curve 502 represents the inductive current component of the plasma, with the plasma current value shown on scale 510 and the RF power to the plasma coil shown on scale 512. Curve 507 represents the decrease 508 in the capacitive current component of the plasma when a jump in the plasma intensity occurs. Curve 503 represents the increase 504 in inductive current component of the plasma when a jump in the plasma intensity occurs.

Figure 6:
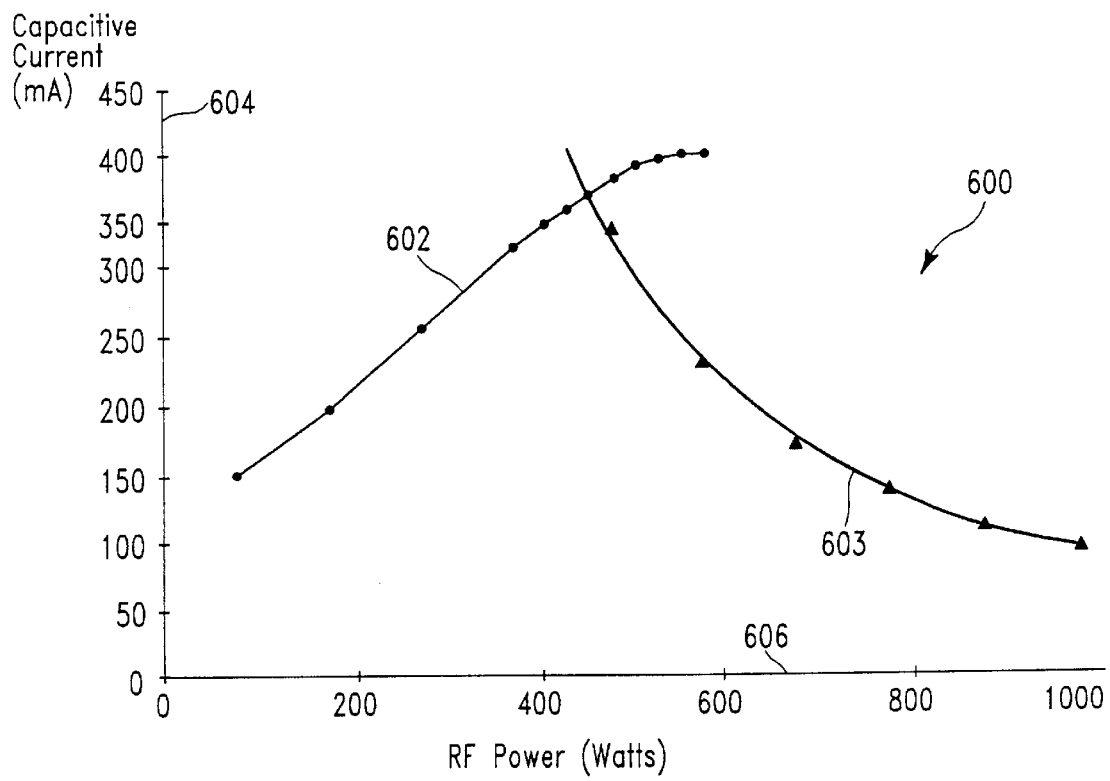
FIG. 6 shows a graph of a capacitive current portion of the plasma current as a function of the amount of power applied for plasma generation, when the etchant plasma comprises $CF_4$, and the etch process chamber is at a pressure of 8 mTorr.

FIG. 6 shows a curve 600 representative of a jump in plasma intensity as a function of RF power applied to generate the plasma, when the pressure in the plasma process chamber 102 (a polysilicon etch chamber) is at a pressure of 8 mTorr. Curve 602 shows the capacitive current component, shown as a function of the RF power to the inductive coil 234 used to produce the plasma in the Centura DPS™ etch chamber 102. The current in milliamps is shown on scale 604, with the RF power input shown on scale 606. When a jump in plasma intensity occurs, the capacitive current component of the plasma jumps from curve 602 to curve 603. A comparison of the RF power wattage at which the decrease in capacitive current occurs in FIG. 5 (at about 270 W) with the RF power wattage at which the decrease in capacitive current occurs in FIG. 6 (at about 470 W) caused applicants to investigate the effect of etch process chamber pressure and RF power wattage upon plasma instability.

Figure 7:
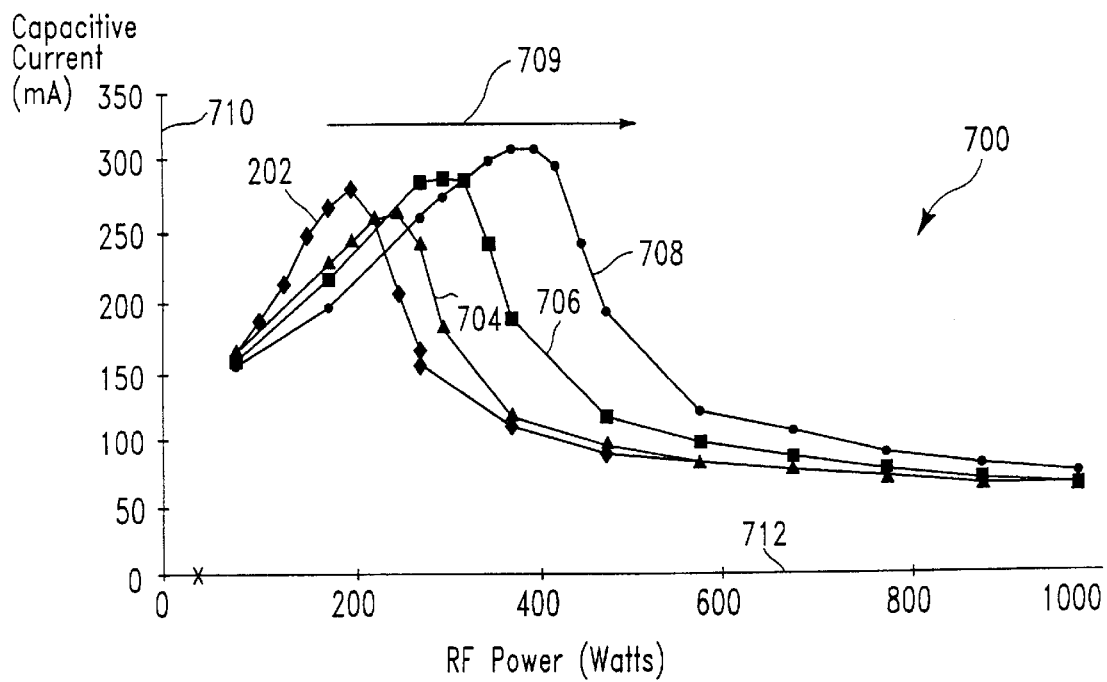
FIG. 7 shows the capacitive current portion of the plasma current as a function of the amount of power applied and as a function of the process chamber pressure for an etch process where the etchant plasma comprises $CF_4$.

FIG. 7 shows a family of curves 700 which represent the sudden decrease in capacitive current component of the plasma (shown in milliamps on scale 710) as a function of RF power applied to the inductive coil used for plasma generation (shown in Watts). Curve 702 shows the effect when the process chamber pressure was at a pressure of 2 mTorr; curve 704 shows the effect at 4 mTorr, curve 706 shows the effect at 6 mTorr, and curve 708 shows the effect at 8 mTorr. Clearly, the point of plasma instability can be moved toward a higher plasma power input by increasing the process chamber pressure during the etch step.

Figure 8:
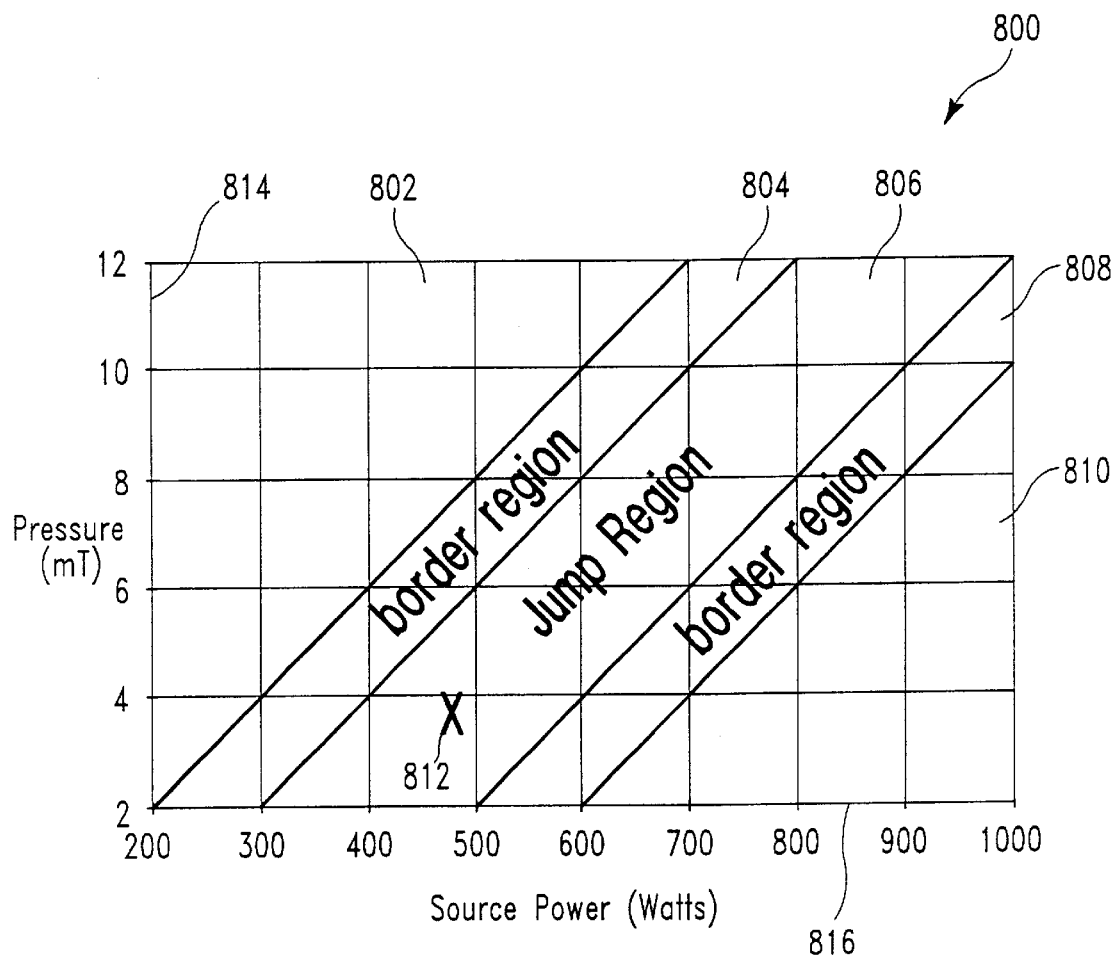
FIG. 8 shows a graph of the plasma stability as a function of the amount of power applied for plasma generation and the process chamber pressure for an etch process where the etchant plasma comprises $CF_4$.

FIG. 8 shows a graph 800 of the plasma stability as a function of the amount of power applied for plasma generation (shown on scale 816 in Watts) and the process chamber pressure (shown on scale 814 in mTorr). The unstable plasma occurs during the time period when the sudden decrease in capacitive current component occurs. Operation of the etch process at a power input and process chamber pressure combination shown as area 802, where $[\partial P_{cap}/\partial P_{RF}]$ is greater than 0, or at a power input and process chamber pressure combination shown as area 810, where $[\partial P_{cap}/\partial P_{RF}]$ is less than 0, and $P_{cap} \ll P_{RF}$ (typically, $P_{cap}$ is about 10% or less than $P_{RF}$) ensures plasma stability. Given plasma stability, it is possible to have a reliable timed etch end point. Applicants' original (baseline) etch process is represented by point 812 on graph 800. It is readily apparent that the original etch process was in the unstable plasma regime, and this explains the unpredictable timed etch end points which were observed under the etch process conditions used.

FIG. 9 shows a graph 900 of data for plasma emission signal intensity from an emission end point system, as a function of etch time during a series of wafer etch experiments. In particular, the plasma signal intensity is shown in a.u. on scale 922 and the etch time in seconds is shown on scale 924. The original, unpredictable baseline etch process is represented by curve 902. After applicants discovered the reason for the plasma instability, applicants were able to conduct a series of experimental polysilicon etch processes in which stable plasmas were obtained, and these experiments are shown on graph 900. These experiments will be discussed in more detail subsequently.

Figure 10:
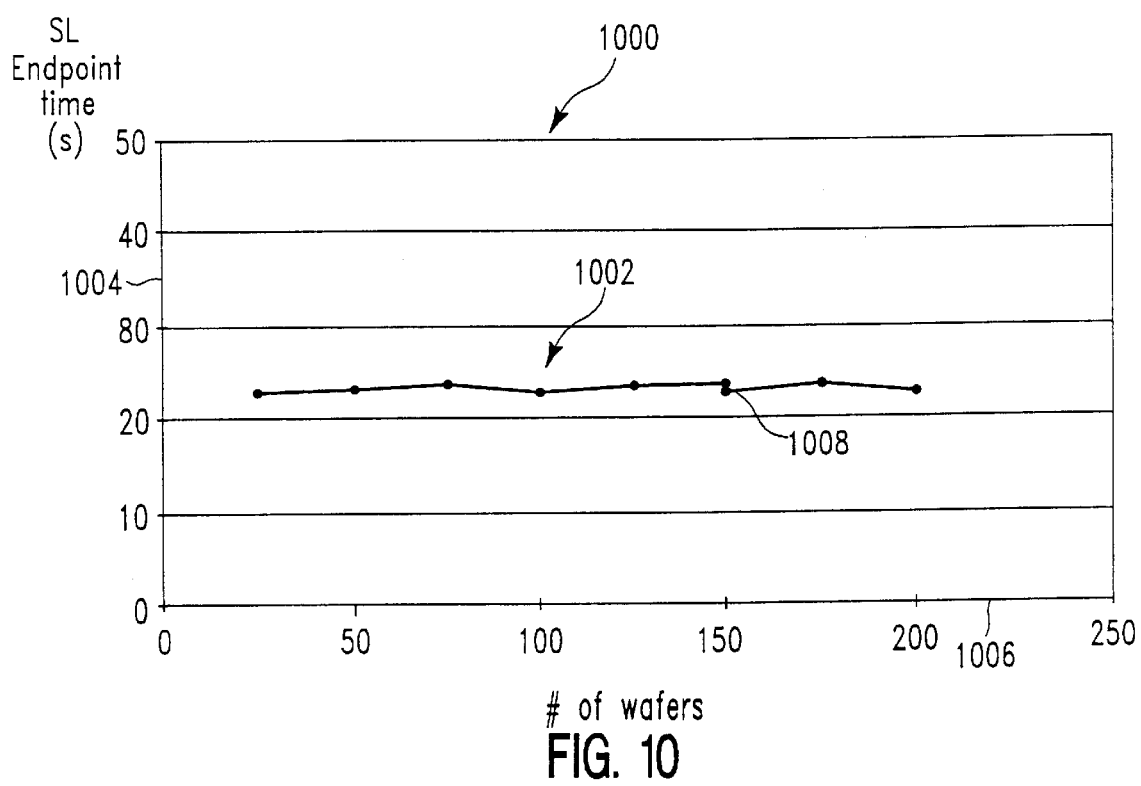
FIG. 10 shows the reliability of a timed end point etch of polysilicon when the method of the present invention is used to ensure that the etch plasma is stable and the plasma density is controlled within a narrow range.

FIG. 10 shows a curve 1002 which represents the reliability of a timed end point etch of polysilicon when the method of the present invention is used to ensure that the etch plasma is stable and the plasma density is controlled within a narrow range. In particular, the time required to etch polysilicon layer 304 (in FIG. 3B) to a desired thickness 303 is plotted to produce curve 1002 based on test data for 200 test etch wafers. The time required is shown on scale 1004, and the wafer number is shown on scale 1006. The time variation was approximately ±5%. At the point indicated as 1008, the processing of wafers was idled for 12 hours, the chamber was seasoned using 3 wafers, and processing was resumed. The minute change in endpoint time after a 12 hour idle shows the flexibility of the process.

The plasma stability may be controlled by selection of operating conditions that provide stable plasma deposition of the RF power supplied to generate the plasma. The process conditions are provided by choosing both the RF power applied to the inductively coupled source for plasma generation and the etch chamber operating pressure, in view of the particular gases from which the plasma is generated.

A stable plasma may be obtained within two process regions a stable plasma may be obtained within two process regions. In the first region, the gradient of the capacitive power to the power applied to the inductively coupled source for plasma generation $[\partial P_{cao}/\partial P_{RF}]$ is greater than 0. In the second region, plasma stability is controlled so that $[\partial P_{cao}/\partial P_{RF}]$ is less than 0 and so that $P_{cap} << P_{RF}$. Typically, $P_{cap}$ is about 10% or less than $P_{RF}$. In these equations, $P_{cap}$ is the calculated capacitive power deposited to the plasma, and $P_{RF}$ is the actual power applied. The stability of power deposition to the substrate (workpiece) is achieved by choosing both the RF power level applied to the inductively coupled plasma generation source and the operating pressure in the process chamber to provide a stable plasma. It is preferred to operate under conditions where $[\partial P_{cao}/\partial P_{RF}]$ is greater than 0, because the etch results are superior, due to a more favored ion to neutral ratio in the plasma.

We have also discovered that in a plasma processing apparatus having a dual power control (where the power applied to generate the plasma is separately controlled from power applied to bias the substrate to be etched), at a given application of power to the plasma generation source, the stability of the plasma may be extended by increasing the pressure in the etch process chamber. This enables operation of the etch process using lower power application for plasma generation. The stable plasma operating regime is overlaid upon the process which permits etching of different silicon-containing layers at substantially the same etch rate, while reducing the need to clean the process chamber. Further, process conditions may be adjusted to provide the desired etch profile, with reduced microloading effect; the desired selectivity toward the silicon-containing layers relative to an adjacent layer of material (such as a patterned resist layer); and etch uniformity across a substrate. The stable high density plasma combined with the etch chemistry and multiple step method disclosed herein provides a more uniform three dimensional etch across the wafer, in general.

In particular, the plasma stability may is controlled by selection of operating conditions that provide stable plasma deposition of the RF power supplied to generate the plasma. The process conditions are provided by choosing both the RF power applied to the inductively coupled source for plasma generation and the etch chamber operating pressure, in view of the particular gases from which the plasma is generated.

Another potential method for determining whether the plasma will be stable is to actually measure the capacitive and inductive components of the plasma. In this case the measured capacitive component is $P_{cap2}$ and the measured inductive component is $P_{ind}$. In this method, the magnitude of $P_{cap2}$ is less than or equal to 10% of the magnitude of $P_{ind}$. An approximate $P_{cap}$ may be determined by monitoring the amount of RF current flowing to the chamber ground.

When the apparatus used is one for which no data is available, it is possible to determine the two process regions in which a stable plasma may be obtained using minimal experimentation. The first stability region, in which $[\partial P_{cao}/\partial P_{RF}]$ is greater than 0 may be determined by setting $P_{cap2}$ or $P_{cap}$ and $P_{RF}$ so that this condition is met at a relatively low RF power and at a relatively low process chamber pressure (for example, and not by way of limitation, about 2 mTorr). The RF power is then increased until an instability in the plasma is observed. This procedure is repeated for a series of increasing process chamber pressures. The maximum chamber pressure to be used may be determined by the characteristics of the etched feature, etch uniformity across the wafer, selectivity between masking layers and the silicon-containing layer to be etched, and other parameters related to the resultant etched product.

To determine the second stability region, in which the $[\partial P_{cao}/\partial P_{RF}]$ is less than 0 and $P_{cap} << P_{RF}$: $P_{RF}$ may be set at a value about 100% greater than the maximum RF power determined to produce a stable plasma in the first stability region (and at the maximum process chamber pressure used which provided an acceptable result). The process chamber pressure is then decreased until an unstable plasma is observed. The RF power is then decreased and the process chamber pressure at which instability occurs is observed for a number of decreasing RF power applications.

As previously mentioned, not only must there be a stable plasma, but the desired effect must be obtained in terms of the etched features upon the substrate surface. Further, the etch process must be sufficiently clean so that an acceptable number of substrates can be processed prior to the need to wet clean the process chamber. Prior to development of the present invention, it was not uncommon that the etch process chamber had to be wet cleaned after processing only about 100 to about 300 wafers. Using the present method, we have been able to increase the number of wafers processed to about 1,000 to 3,000, depending on the substrate materials and the particular composition of the etchant plasma.

In a preferred embodiment of the invention, for etching silicon-containing layers, the process gases from which the plasma is produced include one or more of HBr, $Br_2$, and $CH_3Br$; a chlorine-containing gas, such as $Cl_2$ and/or HCl; an inorganic fluorinated gas such as $NF_3$, $CF_4$, $SF_6$, and combinations thereof; and an oxygen-comprising gas which is typically diluted with an inert gas. The combination of process gas components is selected to provide the desired selectivity so that the silicon-containing layer will etch at a significantly more rapid rate than an adjacent layer, for example, the masking layer used to pattern the silicon-containing layer. Typically the masking layer is a DUV resist or an I-line resist (which do not contain silicon). The silicon-containing layer may contain doped and undoped regions, and when this is the case, the combination of process gas components is further selected to etch the doped and undoped regions at etching rates which typically do not differ more than about 10%.

The features to be etched into the silicon-containing layers typically have a feature size of less than about 0.5 $\mu$. In addition, frequently the aspect ratio of the features is greater than 2:1. To etch features of this size and have a satisfactory etched structure, there are several critical results which must be achieved during the etch process. The etch rate of the silicon-containing layer should be at about 1,500 Å/min. or higher to be economically advantageous. (When a two step etch process is used, wherein a first portion of the layer is etched rapidly and a second portion approaching the end point is etched more slowly, it is the first portion etch which should be at this etch rate.) The etch selectivity of the silicon-containing layer relative to an adjacent layer (the ratio of the etch rate of the silicon-containing layer to the etch masking layer, for example) should be at least 2:1. When the feature being etched is lines and spaces, the profile angle for the etched feature should range from about 88° to about 90°. The profile microloading should be less than about 2°, and the etch uniformity across the substrate should not vary by a standard deviation, $\sigma$, of more than about ±2%.

V. A Self-cleaning Method for Obtaining a Reliable Timed Etch End Point and Uniform Etching of Silicon-containing Films of Varying Chemical Composition by Providing a Stable Plasma in a Dual Power Plasma Etch System We have discovered that silicon-containing layers can be etched using a timed etch end point with reliable results, for a four gas source plasma containing $CF_4$, so long as the plasma is produced at a specific plasma source power input (falling within a specific range) and the etch process chamber is operated at a pressure within a specific range. Further, we have discovered that within the stable plasma process conditions, it is possible to obtain a good profile with good critical dimension bias across the wafer and minimal profile microloading; an increase in selectivity toward the silicon-containing layer relatively to the patterned masking resist; an economically desirable silicon-containing layer etch rate; and, to maintain a clean etch process chamber, by operating the process at a relatively high pressure (about 6–50 mTorr, and preferably from about 8–12 mTorr) and a low plasma source power (less than about 475 W) in a Centura DPS™ polysilicon etch chamber. One skilled in the art would be able to adjust the particular process parameters to obtain similar benefits in other equipment in view of the data presented in Table One and Table Two, below.

The plasma stability has been verified using a 200 wafer test marathon. The four-gas main etch step did not show any plasma jump on the periodic checker board (seasoning) cycle wafers, nor on the electrical critical dimension monitor wafers. End point traces of the plasma signal intensity were flat for the entire etch period and the plasma source shunt position was extremely stable.

The cleanliness of the process was indicated by a 250 wafer etch test. This test showed that the time difference in the process chamber dry clean etch end point after 1 wafer and after 250 wafers is only about 15–20 seconds. This difference is considered negligible.

TABLE ONE

POLYSILICON ETCH PROCESS CONDITIONS FROM DESIGNED EXPERIMENT HIGH PROCESS CHAMBER PRESSURE AND LOW PLASMA SOURCE POWER

| Run # | Pressure (mT) | Plasma Source Power (W) | Substrate Bias Power (W) | $O_2$-He Flow (sccm) |
|---|---|---|---|---|
| Old Baseline | 4 | 475 | 80 | 18 |
| 1 | 8 | 300 | 80 | 8 |
| 2 | 8 | 375 | 100 | 12 |
| 3 | 8 | 450 | 120 | 16 |
| 4 | 10 | 300 | 100 | 16 |
| 5 | 10 | 375 | 120 | 8 |
| 6 | 10 | 450 | 80 | 12 |
| 7 | 12 | 300 | 120 | 12 |
| 8 | 12 | 375 | 80 | 16 |
| 9 | 12 | 450 | 100 | 8 |

Oxygen makes up about 30% by volume of the $O_2$—$He_2$ mixture. The additional process parameters for the data in Table One were held constant at: Plasma source gas component flows of 100 sccm HBr, 60 sccm $Cl_2$, 25 sccm $CF_4$; and, Substrate temperature of 50° C.

The gas flow rates may be adjusted by one skilled in the art depending on the size of the process chamber and the capability of the gas discharge pump to remove gases from the chamber while retaining the desired process chamber pressure. For the CENTURA® DPS™ apparatus described herein, the HBr flow rate typically ranges from between about 20 sccm and about 300 sccm; the $Cl_2$ flow rate typically ranges from about 20 sccm to about 300 sccm, the $CF_4$ flow rate typically ranges from about 5 sccm to about 100 sccm, and the $O_2$ flow rate (excluding diluent) ranges from about 1 sccm to about 100 sccm. When $CF_4$ is used as the inorganic fluorine-containing compound, we have discovered that a flow rate ratio of $O_2$ (excluding diluent) to $CF_4$ in the plasma source gas preferably ranges from about 1:3 to about 1:5. Substrate temperatures from about 0° C. to about 100° C. are expected to work well.

TABLE TWO

ETCH PRODUCT RESULTS FROM DESIGNED EXPERIMENT HIGH PROCESS CHAMBER PRESSURE AND LOW PLASMA SOURCE POWER

| Run # | Etch Rate (Å/min.) | Ratio Etch Rates (I-Line: Poly S) | Uniformity (%) | Profile Angle (°) | Profile Load (°) | CD Bias Range (nm) |
|---|---|---|---|---|---|---|
| Old Bsln. | 2,500 | 2.9 | 3.0 | 89 | 2.0 | 21.2 |
| 1 | 1,690 | — | 2.4 | 88 | 1.5 | 7.2 |
| 2 | 2,100 | — | 3.7 | 89 | 1.25 | 11.3 |
| 3 | 2160 | — | 1.5 | 87.5 | 1.25 | 6.5 |
| 4 | 1840 | — | 4.6 | 89 | 1.5 | 9.1 |
| 5 | 2060 | — | 2.9 | 88.75 | 2.75 | 7.5 |
| 6 | 2230 | 4.5 | 2.4 | 89.5 | 1 | 9.1 |
| 7 | 1740 | — | 2.2 | 88 | 1 | 11 |
| 8 | 2030 | — | 1.5 | 89 | 1.5 | 13.7 |
| 9 | 2210 | — | 3.1 | 88.25 | 1.5 | 14.5 |

Where Uniformity is the "max-min" percentage anywhere across the wafer, and Max-min = (maximum value − minimum value)/2 × average value; Profile Load is (profile θ degrees in a dense area − profile θ degrees in an isolated area); and, the CD bias is the printed feature critical dimension − the etched feature critical dimension, with CD bias range being the maximum difference in CD bias across the wafer.

The features etched were lines and spaces, where the line width was 0.18 μm and the space width was 0.18 μm in the dense areas and about 3.0 μm in the isolated areas.

A comparison of the Table Two data for the "Old Baseline" which was a process operated under unstable plasma conditions with Run #'s 2–9 which are for a process operated under stable plasma conditions shows that a substantially improved Selectivity and CD Bias Range are obtained by operating under stable plasma conditions.

The above described preferred embodiments are not intended to limit the scope of the present invention, as one skilled in the art can, in view of the present disclosure, expand such embodiments to correspond with the subject matter of the invention claimed below.

We claim:

1. An apparatus for creating a stable plasma in a processing chamber, wherein said processing chamber comprises an inductively coupled plasma source, said apparatus including a computer automated control system which contains instructions for applying a predetermined RF power level to said inductively coupled plasma source and for applying a corresponding predetermined process chamber pressure in said processing chamber, with a RF power input having a power level $P_{RF}$, with a part of said RF power input being coupled to said plasma source as a capacitive power component, $P_{cap}$, and wherein said predetermined RF power level is such that $\partial P_{cap}/\partial P_{RF}$ is greater than 0, or $\partial P_{cap}/\partial P_{RF}$ is less than 0 and, wherein the magnitude of $P_{cap}$ is about 10% or less than the magnitude of $P_{RF}$, whereby a plasma created is said processing chamber is maintained in a stable condition.

2. The apparatus of claim 1, wherein said computer automated control system contains instructions for maintaining said RF power level below about 450 W and for maintaining said process chamber pressure within a range from about 6 mTorr to about 50 mTorr.

3. The apparatus of claim 1, wherein said apparatus includes a capacitive current monitoring device and said computer automated control system uses input from said capacitive current monitoring device to adjust at least one element within said apparatus to maintain said plasma in said stable condition.

4. The apparatus of claim 3, wherein said at least one element adjusted to maintain said plasma in a stable condition includes a power controller which determines the amount of RF power applied to said plasma source.

5. The apparatus of claim 4, wherein said at least one element adjusted to maintain said plasma in a stable condition further includes a device which controls said pressure in said processing chamber.

* * * * *